United States Patent
Shi et al.

(10) Patent No.: US 6,614,274 B1
(45) Date of Patent: Sep. 2, 2003

(54) 2/3 FULL-SPEED DIVIDER USING PHASE-SWITCHING TECHNIQUE

(75) Inventors: Bingxue Shi, Beijing (CN); Baoyong Chi, Beijing (CN)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/063,836

(22) Filed: May 17, 2002

(51) Int. Cl.[7] .............................................. H03K 25/00
(52) U.S. Cl. ........................ 327/115; 327/117; 327/202; 327/219; 377/47; 377/48
(58) Field of Search ................................ 327/202, 203, 327/212, 213, 215, 218, 219, 115, 116, 117; 377/47, 48, 52

(56) References Cited

U.S. PATENT DOCUMENTS

| | | | | | |
|---|---|---|---|---|---|
| 4,777,388 A | * | 10/1988 | Widener | ...................... | 327/202 |
| 5,801,565 A | * | 9/1998 | Kuo | ........................... | 327/202 |
| 5,859,890 A | * | 1/1999 | Shurboff et al. | ............... | 377/48 |
| 6,157,693 A | * | 12/2000 | Jayaraman | .................... | 377/47 |
| 6,191,629 B1 | * | 2/2001 | Bisanti et al. | .............. | 327/202 |

\* cited by examiner

*Primary Examiner*—Timothy P. Callahan
*Assistant Examiner*—An T. Luu
(74) *Attorney, Agent, or Firm*—Jiang Chyun IP Office

(57) ABSTRACT

A novel 2/3 full-speed divider operating at high speed with low power consumption comprising a ECL D flip-flop in master-slave configuration and a phases-selection block is provided in the present invention. The master latch and slave latch comprise a pair of input terminals, a pair of control terminals, and a pair of output terminals. The master latch further comprises two pairs of complementary cross-couple transistors for amplifying the output of the master latch for entering the phase-selection block. The phase-selection block has a pair of input terminals, a clock signal input terminal, and an output terminal generating an output signal adjusted by a division ratio according to the clock signal. The division ratio is either 1/2 or 1/3 and the divider functions as a 2/3 divider.

8 Claims, 5 Drawing Sheets

2/3 FULL-SPEED DIVIDER USING PHASE-SWITCHING TECHNIQUE

BACKGROUND OF INVENTION

1. Field of the Invention

The present invention relates in general to a full-speed divider, and, more particularly, to a 2/3 full-speed divider which operates at high frequency range and low power consumption, usable in dual modulus prescaler.

2. Description of the Related Art

Phase locked loop (PLL) frequency synthesizers are widely used in various communications systems and microprocessors. Phase locked loop digital frequency synthesizers are used in radio frequency receivers and transmitters to generate a signal whose frequency is precisely controlled. A variable frequency oscillator is controlled with a feedback system consisting of a variable modulus prescaler driven by the oscillator, which in turn drives a programmable digital divider. The output of the programmable digital divider is compared in a phase detector with the output of a reference oscillator and (in some cases) a reference frequency digital divider. The output of the phase detector is filtered to provide the frequency control signal for the oscillator, typically a voltage applied to a diode to control its capacitance. The diode is resonated with an inductor, forming a tuned circuit which controls the frequency of the variable frequency oscillator. The frequency of the synthesizer is changed by changing the effective divide ratio between the variable frequency oscillator and the phase detector, controlled by the modulus of the prescaler and the modulus of the programmable divider. The filter must perform two functions; first, to remove high frequency components of the phase detection process and second, to stabilize the control loop. These requirements are often in conflict. Unwanted spectral components from the filter frequency modulate the variable oscillator, resulting in spurious modulation sidebands which limit the usefulness of the synthesizer system. Controlling these unwanted signal components by lowering the cutoff frequency of the filter reduces the tuning speed.

The 2/3 (or 4/5) full-speed divider is the most crucial block in the high speed dual modulus prescaler. A conventional prescaler is limited to operating at the maximum frequency which consumes a lot of power. Moreover the operating frequency is limited by the operating speed of the prescaler. The performance of conventional dividers is fast enough for high speed and frequency operations. As a result, there is a need for a full-speed divider which operates low power consumption and at high speed.

SUMMARY OF INVENTION

It is an object of the present invention to provide a full-speed divider that can operate at high speed with low power consumption.

A D flip-flop can be implemented using different technologies depending on the application. The present invention provides a divider comprising a D flip-flop that is suitable for very high frequency applications such as in prescalers used in PLL loops. It is common to use an ECL D flip-flop because it gives the best performance in term of product vs. delay characteristics. The ECL logic is a non saturating high speed logic and is commonly used in applications where high speed is more important than current consumption.

In accordance to the preferred embodiment of the present invention, the 2/3 full-speed divider operating at high speed with low power consumption comprising a ECL D flip-flop in master-slave configuration and a phase-selection block is provided. The master latch and slave latch comprise a pair of input terminals, a pair of control terminals, and a pair of output terminals. The master latch further comprises two pairs of complementary cross-couple transistors for amplifying the output of the master latch for entering the phase-selection block. The phase-selection block has a pair of input terminals, a clock signal input terminal, and an output terminal generating an output signal adjusted by a division ratio according to the clock signal. The division ratio is either 1/2 or 1/3 and the divider functions as a 2/3 divider.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
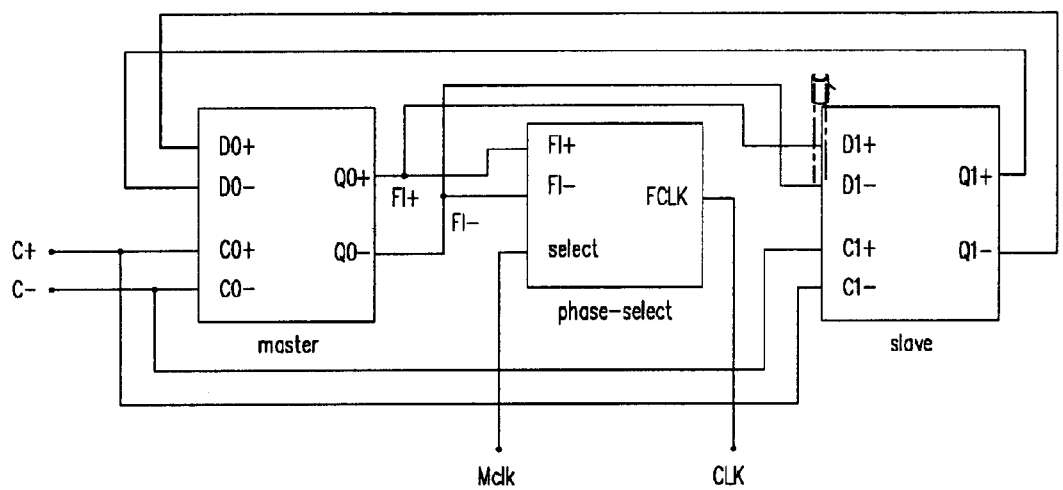
FIG. 1 is a schematic diagram of the 2/3 divider according to the preferred embodiment of the present invention.

FIG. 1 is a schematic diagram of the 2/3 full-speed divider provided in the present invention. The 2/3 divider comprises an improved Master/Slave ECL D-flip-flop (DEF) and a phase-selection block. In FIG. 1, the two latches are connected in the interlaced master-slave topology and clocked in sequence. The master and slave latch are identical and they receive input signals D+, D− and control signals C+, C− and generate output signals Q+, Q−. The control signals C+, C− are shared between the two latches. The phase-selection block is disposed after the master latch and is driven by the output signals Q0+, Q0− from the master latch. Depending on the clock signal Mclk, the phase-selection block generates output signals frequency signal Fl+, frequency signal Fl− which are sent to the slave latch. The two latches cells in master-slave configuration operate one with a logical high control signal and the other with a logical low control signal. The input signals D0+, D0− input the master latch when the control signal C+ is logical high. When the control signal C+ is logical high, the master latch is transparent and the slave latch is latched. When the control signal C+ is logical low and C− is logical high, the output signals Q0+, Q0− from the master latch pass through the phase-selection block for dividing into the input signals D1+, D1− to enter the slave latch. Therefore the master latch is latched and the slave latch is transparent.

Figure 2:
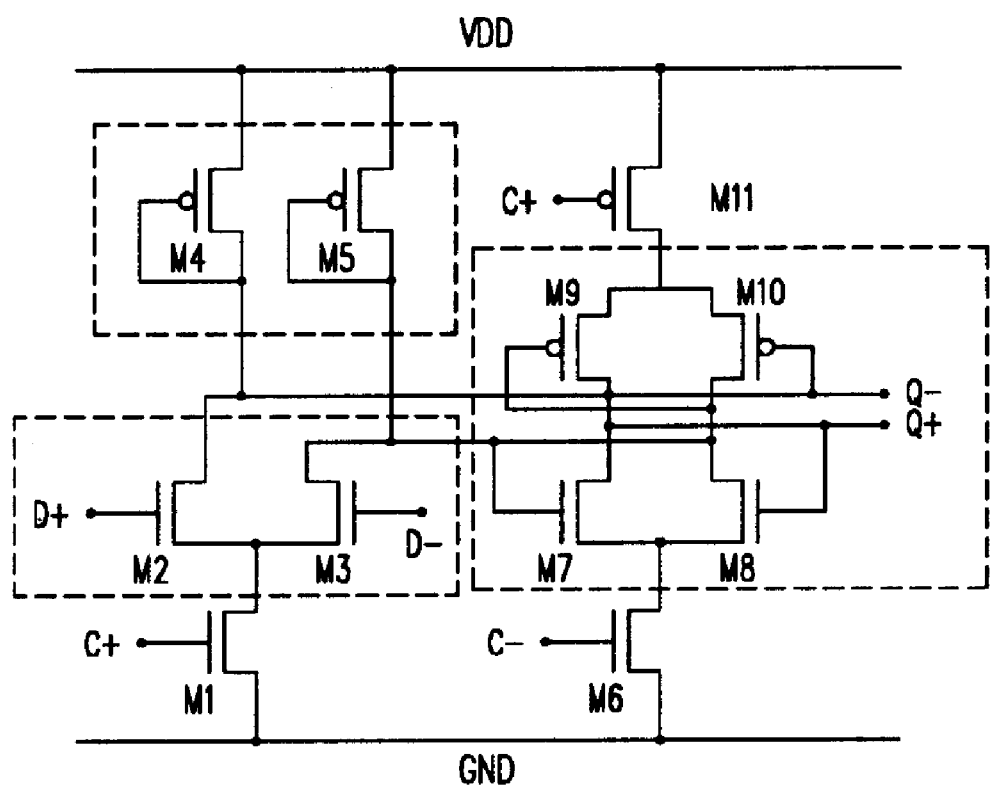
FIG. 2 is a circuit diagram of the master-slave ECL D flip-flop of the 2/3 divider according to the preferred embodiment of the present invention.

FIG. 2 is a circuit diagram of the Master/Slave ECL D flip-flop. M2 and M3 are a differential pair where M4 and M5 are a part of their load. The control signal C+ enters the master/slave ECL D flip-flop at M1, and the input signal D+ enters at M2. The output signals Q+, Q− are generated by two pairs of complementary cross-couple transistors. When the input signal C+ is logical high, the NMOS transistor M1 will operate. An electric potential differential is built at the output of the difference pair according to the input values D+, D−. When the input signal C+ is logical low and C− is logical high, the complementary cross-couple pairs M7, M8 and M9, M10 start to operate. The potential difference is amplified so the circuit returns to latched state. Unlike conventional one NMOS cross-couple pair of transistors, the present invention uses two complementary cross-couple pairs M7, M8 and M9, M10 increases the swing of the output signals (Q+, Q−) to maintain the speed of the ECL D flip-flop. As a consequence, the large swing output signals can directly drive the phase-selection block in a later stage without the need of any amplifiers. The complexity of the overall circuit is decreased.

Figure 3A:
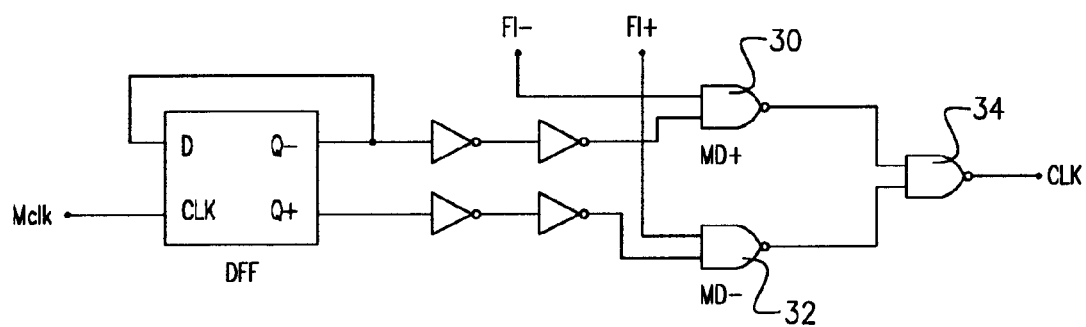
FIG. 3A is a circuit diagram of the phase-selection block of the 2/3 divider according to the preferred embodiment of the present invention.
Figure 3B:
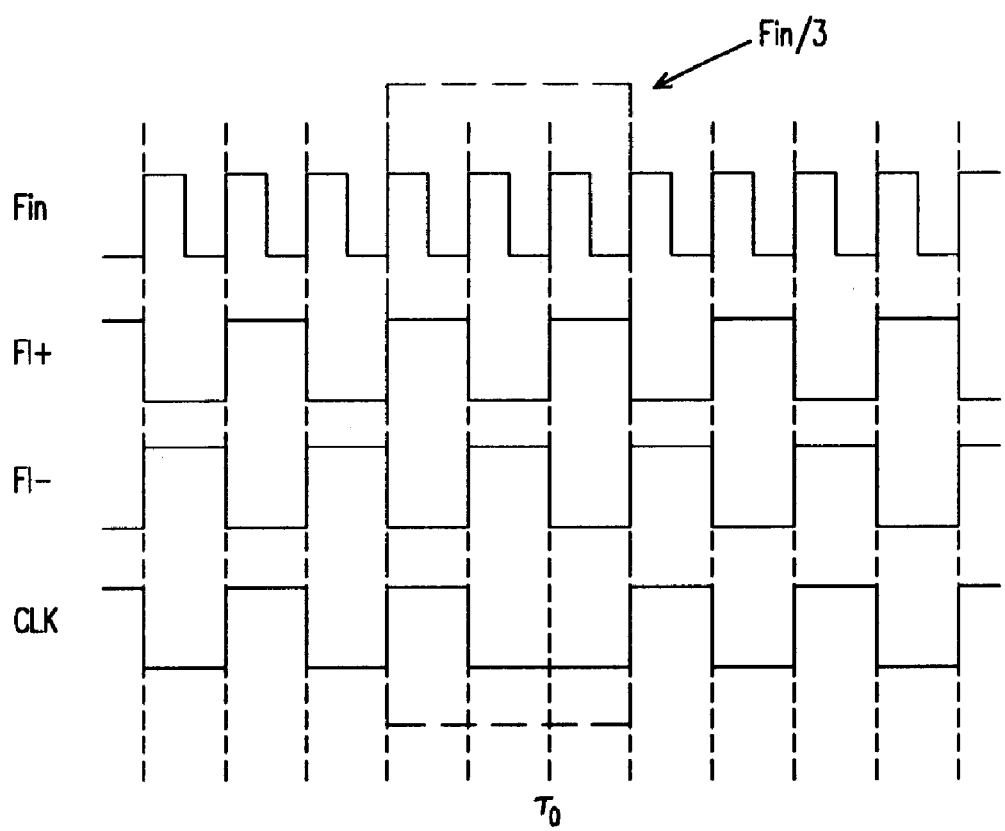
FIG. 3B is a timing chart of the phase-selection block of the 2/3 divider according to the preferred embodiment of the present invention.

FIG. 3A is a circuit diagram of the phase-selection block. Each of the output signals Q+, Q− from the master slave is connected to a pair of inverters. Q− signal becomes control signal MD+ after inversion and enters NAND gate 30 together with a frequency signal Fl− signal. Q+ signal becomes control signal MD− after inversion and enters NAND gate 32 together with a frequency signal Fl+ signal. The output of NAND gate 30 and NAND gate 32 are the inputs of NAND gate 34. NAND gate 34 outputs the CLK signal adjusted by the division ratio according to the Mclk signal. The D flip-flop changes its state when a pulse appears in the clock signal Mclk. The D flip-flop operates at a low frequency and low speed so a common D flip-flop (such as a general TSPC D flip-flop) can be used to save cost. The circuit selects frequency signal Fl+ and frequency signal Fl− according to the control signals MD+, MD−. The principle of this phase-switching technique is illustrated in FIG. 3B. When no pulse appears in clock signal Mclk, output signal CLK outputs according to frequency signal Fl+, its frequency is a one-secondinput frequency. At the time, a pulse appears in clock signal Mclk and output CLK is switched from frequency signal Fl+ to frequency signal Fl− and the frequency at that period $\tau_0$ is one-third (Fin/3)of the input frequency. After a period, the frequency recovers to the one-second of the input frequency again. The divide by 2/3 function is implemented.

During the CLK transition between frequency signal Fl+ and frequency signal Fl−, the risk of creating spikes may occur. In the preferred embodiment, only one transition state (from frequency signal Fl+ to frequency signal Fl−) is discussed. At the beginning of the transition, control signal MD+ is logical high and control signal MD− is logical low. If control signal MD− changes its state so rapidly that the next period frequency signal Fl− signal has not fallen down below the threshold of the NAND gate when control signal MD− has risen above the threshold of the NAND gate, a spike might appear in output signal CLK since output signal CLK changes its selection from frequency signal Fl+ to frequency signal Fl−. If control signal MD+ changes it state so slowly that the next period frequency signal Fl+ signal has risen above the threshold of the NAND gate when control signal MD+ has not fallen down below the threshold of the NAND gate, a spike might also appear in output signal CLK since output signal CLK is still selecting frequency signal Fl+. Only when control signal MD− changes it state not too rapidly and control signal MD+ changes it states not too slowly, the risk of creating spikes does not exist. As a result, four inverters added in the phase-selection block are for the purpose of controlling the control signals MD+, MD− signals. This divider is sized with numerous HSPICE simulations over process variation and temperature variation to ensure proper operation. So the divider is not optimized for a maximum operation but for robustness for the proper variation and temperature variation.

Figure 4:
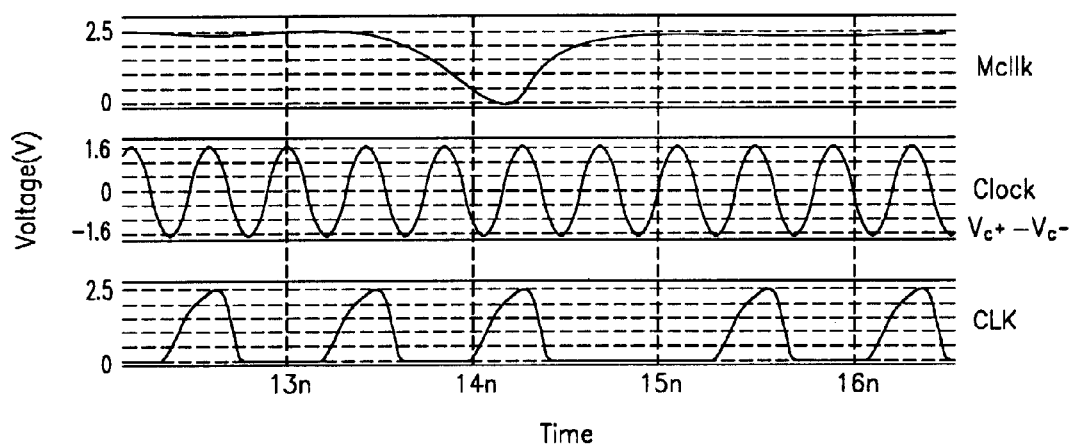
FIG. 4 is a wave chart of the Mclk and CLK signals from the phase-selection block according to the preferred embodiment of the present invention.

FIG. 4 is a wave chart of the transient simulation waveforms of the 2/3 divider using BSlM3.1 (Level 49) transistor models for a standard digital process and fabricated in 0.25 μm logic 1P5M salicide 2.5 V process. The clock frequency is 2.4 GHz and the amplitude of each phase clock signal is 0.8 V. It is illustrated in FIG. 4 that the division ratio is three when a pulse appears in Mclk and the division ratio is two when no pulse appears in Mclk. Although there is some time delay (due to the added inverters in the control signal MD+, MD− path), it does not affect the divider function in the application of the prescaler. The power consumption of the improved 2/3 divider at that frequency is 3.67 mW and the maximum operating frequency of the whole 128/129 prescaler using the improved full-speed divider could be up to 2.8 GHz.

It will be apparent to those skilled in the art that various modifications and variations can be made to the structure of the present invention without departing from the scope or spirit of the invention. In view of the foregoing description, it is intended that the present invention cover modifications and variations of this invention provided they fall within the scope of the following claims and their equivalents.

What is claimed is:

1. A full-speed divider operating at high speed with low power consumption, comprising:

a master latch having a pair of data input terminals, a pair of control signal input terminals, and a pair of differential signal output terminals for exporting differential output signals;

a phase-selection block coupled to the master latch having a pair of input terminals for receiving the differential output signals from the master latch, an input clock signal terminal, and an output terminal for generating an output signal adjusted by a division ratio according to a clock signal to the input clock signal terminal, wherein the phase-selection block further comprises a group of 4 inverters for controlling the differential output signals from the master latch for avoiding spikes; and a slave latch coupled to the master latch, block having a pair of data input terminals for receiving the differential output signals from the master latch, a pair of control signal input terminals which are coupled to the control signal input terminals of the master latch, and a pair of differential signal output terminals coupled to the data input terminals of the master latch.

2. The divider in claim 1, wherein the master latch and the slave latch are master-slave ECL D flip-flop.

3. The divider in claim 1, wherein the master latch further comprises two pairs of transistors for amplifying the differential output signals to the phase-selection block.

4. The divider in claim 1, wherein the division ratio is selected from a group consisting of 1/2 and 1/3 , wherein the divider serves as a 2/3 divider.

5. The divider in claim 1, wherein the data input terminals, the control signal input terminals, and the differential signal output terminals of the master latch are NMOS transistors.

6. The divider in claim 1, wherein an operating frequency of the divider is 2.4 GHz.

7. The divider in claim 1, in the phase-selection block, wherein a first one of the differential signals is set to be the output signal when the input clock signal terminal receives one of logic levels of the clock signal, and a second one of the differential signals is set to be the output signal when the input clock signal terminal receives one of the other logic of the clock signal.

8. A full-speed divider operating at high speed with low power consumption, comprising:

a master latch having a pair of data input terminals, a pair of control signal input terminals, and a pair of differential signal output terminals;

a phase-selection block coupled to the master latch having a pair of input terminals for receiving differential output signals from the master latch, an input clock signal terminal, and an output terminal for generating an output signal adjusted by a division ratio according to a clock signal, wherein a first one of the differential signals is set to be the output signal when the input clock signal terminal receives one of logic levels of the clock signal, and a second one of the differential signals is set to be the output signal when the input clock signal terminal receives one of the other logic levels of the clock signal; and a slave latch coupled to the master latch, having a pair of data input terminals for receiving the differential output signals from the master latch, a pair of control signal input terminals which are coupled to the control signal input terminals of the master latch, and a pair of differential signal output terminals coupled to the data input terminals of the master latch.

* * * * *